(12) United States Patent
Ootorii

(10) Patent No.: US 11,300,739 B2
(45) Date of Patent: *Apr. 12, 2022

(54) OPTICAL TRANSMISSION MODULE

(71) Applicant: Sony Group Corporation, Tokyo (JP)

(72) Inventor: Hiizu Ootorii, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/000,051

(22) Filed: Aug. 21, 2020

(65) Prior Publication Data

US 2020/0386958 A1 Dec. 10, 2020

Related U.S. Application Data

(63) Continuation of application No. 16/353,671, filed on Mar. 14, 2019, now Pat. No. 10,782,491, which is a
(Continued)

(30) Foreign Application Priority Data

Sep. 19, 2013 (JP) ................................. 2013-194048

(51) Int. Cl.
*G02B 6/42* (2006.01)
*H04B 10/50* (2013.01)

(52) U.S. Cl.
CPC ......... *G02B 6/4268* (2013.01); *G02B 6/4214* (2013.01); *G02B 6/4204* (2013.01);
(Continued)

(58) Field of Classification Search
None
See application file for complete search history.

(56) References Cited

U.S. PATENT DOCUMENTS 5,108,027 A * 4/1992 Warner ................ B23K 35/001
228/254
5,622,788 A * 4/1997 Gates, II ................ H01L 24/13
428/688

(Continued)

FOREIGN PATENT DOCUMENTS

CN 1808193 A 7/2006
CN 102472867 A 5/2012
(Continued)

OTHER PUBLICATIONS

Chinese Office Action dated Nov. 4, 2019 for corresponding Chinese Application No. 201810789217.3.

*Primary Examiner* — Michelle R Connelly
(74) *Attorney, Agent, or Firm* — Michael Best & Friedrich LLP

(57) ABSTRACT

An optical transmission module includes: a main substrate having a front surface and a back surface; an optical connector having a connector substrate; a first transparent substrate disposed between the connector substrate and the main substrate; a heat source element disposed between the connector substrate and the back surface of the main substrate, and electrically connected to the main substrate; one or a plurality of wirings electrically connecting the heat source element to the main substrate, and each configured to transfer heat generated from the heat source element and the first transparent substrate, to the main substrate; a first special region preventing the heat generated from the heat source element and the first transparent substrate, from being transferred to the connector substrate; and a second special region providing a function of transferring the heat generated from the heat source element and the first transparent substrate.

19 Claims, 12 Drawing Sheets

Related U.S. Application Data continuation of application No. 15/879,235, filed on Jan. 24, 2018, now Pat. No. 10,270,532, which is a continuation of application No. 14/475,702, filed on Sep. 3, 2014, now Pat. No. 9,893,815.

(52) U.S. Cl.
CPC .. *G02B 6/4272* (2013.01); *H01L 2224/16225* (2013.01); *H01L 2924/15192* (2013.01); *H01L 2924/15311* (2013.01)

(56) References Cited

U.S. PATENT DOCUMENTS

| | | | | |
|---|---|---|---|---|
| 6,643,075 B2* | 11/2003 | Wang | ............... | G02B 6/423 |
| | | | | 359/811 |
| 6,782,164 B1* | 8/2004 | Lee | ............... | G02B 6/124 |
| | | | | 372/20 |
| 9,893,815 B2* | 2/2018 | Ootorii | ............... | G02B 6/4268 |
| 10,270,532 B2* | 4/2019 | Ootorii | ............... | G09G 3/3233 |
| 10,782,491 B2* | 9/2020 | Ootorii | ............... | G02B 6/4268 |
| 2003/0095346 A1 | 5/2003 | Nasu et al. | | |
| 2004/0234210 A1 | 11/2004 | Nagasaka et al. | | |
| 2005/0105860 A1 | 5/2005 | Oono et al. | | |
| 2006/0078248 A1 | 4/2006 | Sasaki et al. | | |
| 2006/0182397 A1 | 8/2006 | Benner et al. | | |
| 2007/0210400 A1 | 9/2007 | Moribayashi et al. | | |
| 2009/0208167 A1* | 8/2009 | Hodono | ............... | G02B 6/43 |
| | | | | 385/14 |
| 2009/0298236 A1* | 12/2009 | Dang | ............... | H01L 24/32 |
| | | | | 438/121 |
| 2010/0215325 A1 | 8/2010 | Tamura | | |
| 2011/0044369 A1* | 2/2011 | Andry | ............... | G02B 6/4204 |
| | | | | 372/50.124 |
| 2011/0216998 A1 | 9/2011 | Symington et al. | | |
| 2012/0099816 A1* | 4/2012 | Wilson | ............... | H01S 5/02251 |
| | | | | 385/33 |
| 2014/0294342 A1 | 10/2014 | Offrein | | |

FOREIGN PATENT DOCUMENTS

| | | |
|---|---|---|
| JP | 2004-240220 A | 8/2004 |
| JP | 2005-252041 A | 9/2005 |
| JP | 2007-249194 A | 9/2007 |

* cited by examiner

OPTICAL TRANSMISSION MODULE

CROSS REFERENCE TO RELATED APPLICATIONS

This Application is a Continuation Application of application Ser. No. 16/353,671, filed Mar. 14, 2019 which is a Continuation of application Ser. No. 15/879,235, filed Jan. 24, 2018 which is a Continuation Application of application Ser. No. 14/475,702, filed Sep. 3, 2014 and issued as U.S. Pat. No. 9,893,815 on Feb. 13, 2018, which claims the benefit of Japanese Priority Patent Application JP 2013-194048 filed Sep. 19, 2013, the entire contents of these applications are incorporated herein by reference.

BACKGROUND

The present disclosure relates to an optical transmission module used for transmission of light.

An optical transmission module with insertable and removable optical connector typically has a configuration in which an optical connector is disposed on a main substrate mounted with an optical element and a drive circuit (see Japanese Unexamined Patent Application Publication Nos. 2007-249194, 2004-240220, and 2005-252041).

SUMMARY

However, the optical element and the drive circuit become high temperature, and therefore heat radiated therefrom deforms a vulnerable optical connector, which may accordingly deteriorate optical coupling efficiency between the optical element and the optical connector.

In the configuration described in Japanese Unexamined Patent Application Publication No. 2007-249194, an optical element and a drive element are enclosed by a flexible board to be contained in a housing. In this configuration, since an optical connector is directly fixed to the housing containing a heat source, there is a high possibility that optical coupling efficiency is deteriorated due to thermal deformation.

The invention described in Japanese Unexamined Patent Application Publication No. 2004-240220 is mainly to perform positioning of an optical connector with high accuracy, and has no regard for enhancing heat radiation property. Therefore, heat of a drive element is directly transferred to the optical connector, which may cause deterioration in optical coupling efficiency due to thermal deformation.

In Japanese Unexamined Patent Application Publication No. 2005-252041, although the description is made of heat radiation, there is room for improvement in heat radiation property. In particular, the heat radiation effect is described (incorrectly) oppositely to the intention of the present disclosure. For example, in a paragraph [0030] of Japanese Unexamined Patent Application Publication No. 2005-252041, there is description that the heat source element is made not in contact with a main substrate, which makes it possible to radiate heat more effectively. However, when the heat source element is not in contact with the main substrate, the heat radiation property is extremely low.

It is desirable to provide an optical transmission module capable of suppressing deformation by heat and deterioration in optical coupling efficiency.

According to an embodiment of the disclosure, there is provided an optical transmission module including: a main substrate having a front surface and a back surface; an optical connector having a connector substrate; a first transparent substrate disposed between the connector substrate and the main substrate; a heat source element disposed between the connector substrate and the back surface of the main substrate, and electrically connected to the main substrate; one or a plurality of wirings electrically connecting the heat source element to the main substrate, and each configured to transfer heat generated from the heat source element and the first transparent substrate, to the main substrate; a first special region provided between the connector substrate and the first transparent substrate to prevent the heat generated from the heat source element and the first transparent substrate, from being transferred to the connector substrate; and a second special region provided between the heat source element and the back surface of the main substrate to provide a function of transferring the heat generated from the heat source element and the first transparent substrate.

In the optical transmission module according to the embodiment of the disclosure, transfer of the heat generated by the heat source element and the first transparent substrate is suppressed in the first special region formed between the connector substrate and the first transparent substrate. It becomes possible to provide the function of transferring the heat generated by the heat source element and the first transparent substrate in the second special region formed between the heat source element and the back surface of the main substrate.

In the optical transmission module according to the embodiment of the disclosure, the first special region to suppress transfer of the heat and the second special region to provide the function of transferring the heat are provided. Therefore, it is possible to suppress deformation by the heat and deterioration in optical coupling efficiency between the connector substrate and the first transparent substrate.

Note that, the effects described here are not necessarily limited, and any of effects described in the present disclosure may be obtained.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

Hereinafter, preferred embodiments of the disclosure will be described in detail with reference to drawings. Note that description will be given in the following order.
1. First Embodiment
1.1 Configuration and Function
1.2 Effects
1.3 Modifications of First Embodiment
 1.3.1 First Modification
 1.3.2 Second Modification
 1.3.3 Third Modification
2. Second Embodiment
3. Third Embodiment
4. Fourth Embodiment
5. Fifth Embodiment
6. Sixth Embodiment
 6.1 First Configuration Example
 6.2 Second Configuration Example
 6.3 Third Configuration Example
7. Seventh Embodiment
 7.1 First Configuration Example
 7.2 Second Configuration Example
8. Eighth Embodiment
9. Ninth Embodiment
10. Tenth Embodiment
11. Eleventh Embodiment
13. Thirteenth Embodiment
14. Fourteenth Embodiment
15. Fifteenth Embodiment
16. Sixteenth Embodiment
17. Seventeenth Embodiment
18. Eighteenth Embodiment
19. Other Embodiments 1. First Embodiment (1.1 Configuration and Function)

Figure 1:
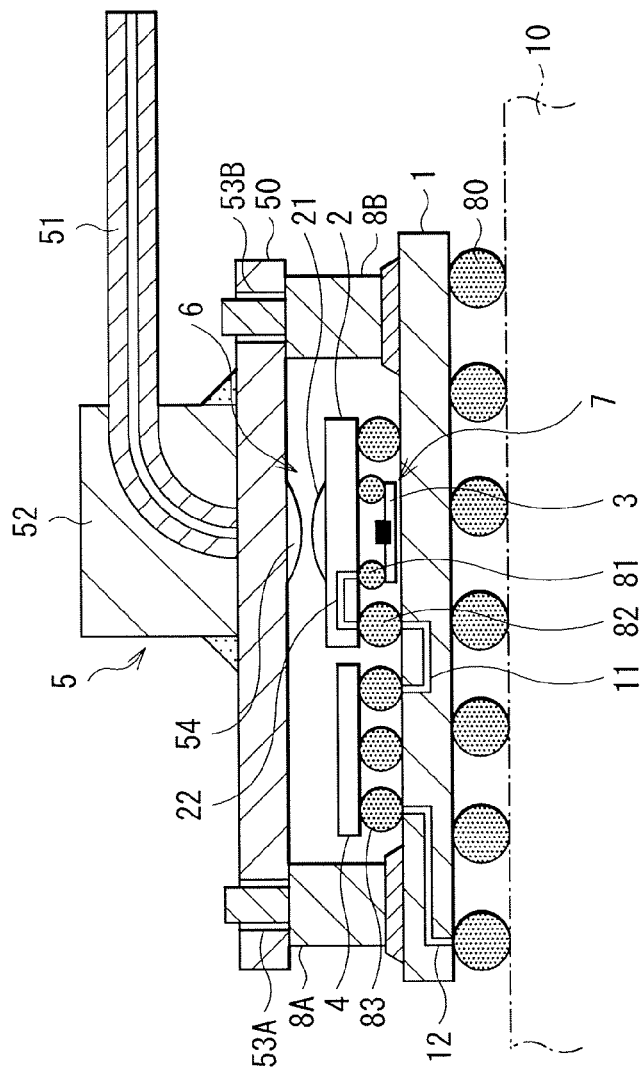
FIG. 1 is a sectional diagram illustrating a configuration example of an optical transmission module according to a first embodiment of the disclosure.

FIG. 1 illustrates a configuration example of an optical transmission module according to a first embodiment of the disclosure.

As illustrated in FIG. 1, the optical transmission module has a main substrate 1, a transparent substrate (a first transparent substrate) 2, an optical element 3, a drive element 4, and an optical connector 5. The optical connector 5 has a synthetic resin substrate (i.e. a connector substrate, hereinafter simply referred to as a resin substrate) 50. In the first embodiment, the optical element 3 disposed on a back surface side of the transparent substrate 2 is an example of a heat source element. Incidentally, when the drive element 4 is disposed on the back surface side of the transparent substrate 2 as with configuration examples (FIG. 13 to FIG. 24) described later, the drive element 4 may become a heat source element.

The main substrate 1 has a front surface and a back surface. The back surface side of the main substrate 1 is connectable to a mother board 10 with a bump 80 in between. Incidentally, the main substrate 1 itself may be the mother board 10. An end of an optical cable 51 is fixed to the resin substrate 50 by a fixing member 52. The resin substrate 50 has a lens part 54 and positioning holes 53A and 53B. The main substrate 1 and the resins substrate 50 of the optical connector 5 are oppositely disposed and fixed by positioning pins 8A and 8B and the positioning holes 53A and 53B.

The transparent substrate 2 is disposed between the resin substrate 50 and the main substrate 1. The transparent substrate 2 has an optical function part such as a lens part 21 formed to face the resin substrate 50. The optical element 3 is disposed between the resin substrate 50 and the back surface of the main substrate 1, and is electrically connected with the main substrate 1 through a bump 81, a wiring 22, a bump (a connection section) 82, and a wiring 11. The drive element 4 is disposed between the resin substrate 50 and the back surface of the main substrate 1, and is electrically connected with the main substrate 1 through a bump 83 and a wiring 12. Each of the bumps 80 to 83 is a solder bump. Each of the wirings 22, 11, and 12 has a function of transferring heat that is generated by the transparent substrate 2 and the optical element 3 as a heat source element, to the main substrate 1, in addition to a function of electrical connection.

A first special region (a connector-side special region, or a special region 6) to prevent the heat that is generated by the transparent substrate 2 and the heat source element from being transferred to the resin substrate 50 is provided between the resin substrate 50 and the transparent substrate 2. A second special region (a body-side special region, or a special region 7) to provide a function of transferring heat that is generated by the transparent substrate 2 and the heat source element is provided between the heat source element and the back surface of the main substrate 1.

As described above, on the main substrate 1 side of the transparent substrate 2, the wiring 22 that electrically connects the heat source element with the main substrate 1 and transfers, to the main substrate 1, the heat generated from the heat source element and the transparent substrate 2 is provided so as to be embedded in a surface closer to the main substrate 1. The optical element 3 is mounted below the transparent substrate 2, as one of the heat source elements. In addition, the special region 7 to provide the function of transferring the heat of the heat source element to an opposite side direction of the transparent substrate 2 is provided on the main substrate 1 side of the heat source element. On the other hand, the special region 6 is provided between the transparent substrate 2 and the resin substrate 50 of the optical connector 5 on a side of the transparent substrate 2 opposite to the main substrate 1.

The transparent substrate 2 is transparent to a wavelength of light used in optical transmission. The transparent substrate 2 may be formed of any kinds of material that has permeability to the wavelength of an optical signal propagating through the optical connector module, such as resin, glass, and quartz. Incidentally, a material having low thermal conductivity may be preferable in order to prevent the heat generated by the optical element 3 from being transferred to the optical connector 5 side. For example, a material having thermal conductivity lower than that of a wiring material (such as Al and Cu) that is formed to release the heat to the main substrate 1 may be preferable.

Moreover, the transparent substrate 2 is not limited to a plate shape, and may have optical function parts such as the lens part 21 and a diffraction grating. These are provided on a side opposite to the wiring 22, of the transparent substrate 2. The optical function parts such as the lens part 21 may be preferably provided so that light correcting shapes of the respective optical function parts are formed on the optical axis same as a light emitting section of the optical element 3. In addition, when a plurality of optical functional shapes are provided, an outer size of each shape may be preferably equal to or smaller than an arrangement pitch of the optical elements 3.

The heat source element is not limited to the optical element 3 (a light emitting element, or a photodetector), and may be the drive element 4 for the optical element 3, other functional element, or an element including a plurality of these elements. The main substrate 1 may be a substrate capable of being provided with wirings, such as an organic substrate, a ceramic substrate, and a flexible substrate.

A lens substrate (the resin substrate 50) of the insertable and removable optical connector 5 is desired to have high accuracy in terms of the positioning holes (holes 53A and 53B), positional relationship with lens, and its shapes. For example, there is a case where variation in positional accuracy of ±10 μm or lower is demanded. On the other hand, it is necessary to flexibly absorb slightly generated displacement of positional relationship between the positioning pins 8A and 8B and the holes (holes 53A and 53B) without backlash. Further, to reduce its cost, preferably, an injection-moldable resin material may be employed as the material of the resin substrate 50, and the lens part 54 and the holes 53A and 53B may be formed by integral molding. As a result, it is possible to achieve increased accuracy at a time.

When a resin is employed for the lens substrate of the optical connector 5, however, thermal deformation easily occurs because thermal expansion coefficient of the resin is high. To suppress such deformation, it is necessary to provide the special region 6 between the transparent substrate 2 and the optical connector 5 to prevent the heat from being directly transferred from the transparent substrate 2 to the optical connector 5. However, the optical connector 5 receiving the heat easily deforms structurally due to the floating configuration. According to the configuration of the first embodiment, it is possible to suppress the thermal deformation of the optical connector 5 made of resin.

An optical fiber, a waveguide, and the like are used for the optical cable 51 of the optical connector 5. These are adhered to the lens substrate (the resin substrate 50) through the fixing member 52. Incidentally, in the case of the waveguide, the fixing member 52 may be omitted and the waveguide may be adhered directly on the resin substrate 50. Moreover, the shape of the fixing member 52 may have any of various structure to introduce light from the lens to the optical cable 51, such as a vertically drawable shape, an obliquely drawable shape, a groove fixing shape, a shape sandwiching the optical cable 51 with the resin substrate 50, and a shape containing a reflective mirror function in between, without being limited to a horizontally drawable shape illustrated in the figure. The adhesive having permeability to a propagating optical signal and having refractive index close to that of the optical transmission path is employed. Moreover, the adhesive may function as the fixing member 52.

The lens part 54 of the resin substrate 50 of the optical connector 5 is formed of an injection resin material having permeability to the propagating optical signal. The parts other than the lens part 54 may be formed of a material not having permeability; however, the lens part 54 and the holes 53A and 53B are integrally formed because the positional relationship with high accuracy is necessary as described above.

The positioning pins 8A and 8B are inserted in the holes (the holes 53A and 53B) of the optical connector 5. As the material of the positioning pins 8A and 8B, metals such as brass, copper, and aluminum may be preferable; however, a resin material molded with high accuracy may be used. The plurality of pins 8A and 8B are disposed in the vicinity of the transparent substrate 2 on the main substrate 1. Four or more pins 8A and 8B may be desirably located at four or more positions surrounding the lens part 21 or the lens part 54. However, in the case where the lens is arranged in one line, the pins 8A and 8B may be located at only two positions sandwiching the lens line.

The pins 8A and 8B may desirably have a step shape with flange in order to provide the special region 6 between the transparent substrate 2 and the resin substrate 50, and to be stably adhered to the resin substrate 50 or the main substrate 1. The pins 8A and 8B are positioned and fixed to the resin substrate 50 or the main substrate 1 by solder bonding or an adhesive.

(1.2 Effects)

As described above, according to the first embodiment, since the special region 6 to suppress the heat transfer and the special region 7 to provide the function of transferring the heat are formed, it is possible to suppress deformation by the heat and deterioration of optical coupling efficiency. Moreover, the first embodiment may be carried out with less and small components at low cost.

Note that effects described in the present specification are merely examples without limitation, and other effects may be obtained.

(1.3 Modification of First Embodiment)
(1.3.1 First Modification)

Figure 2:
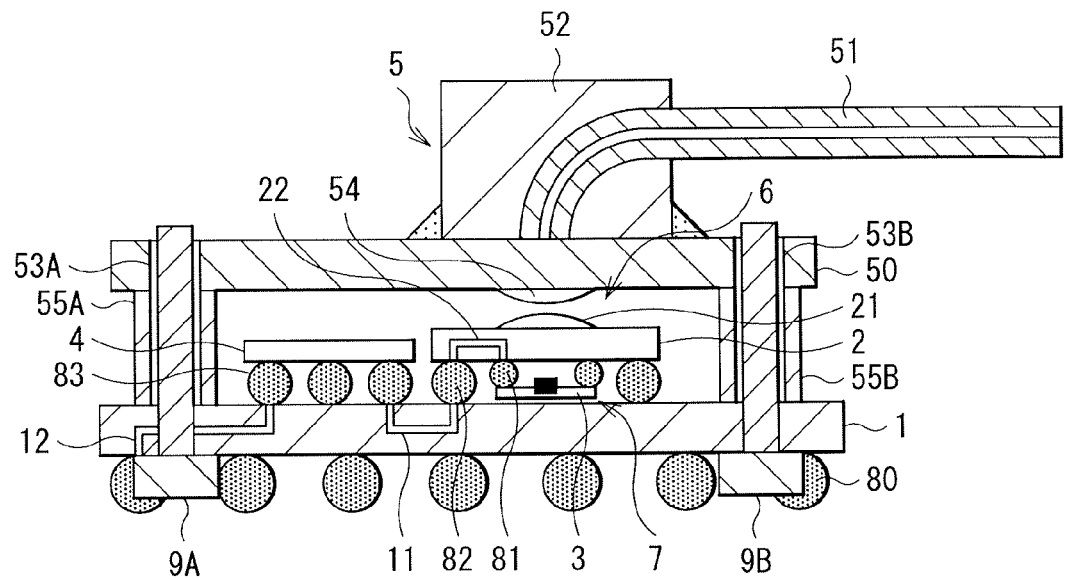
FIG. 2 is a sectional diagram illustrating a configuration example of an optical transmission module according to a first modification of the first embodiment.

FIG. 2 illustrates a configuration example of an optical transmission module according to a first modification of the first embodiment. In the first modification, pins 9A and 9B are provided in place of the pins 8A and 8B in the configuration of FIG. 1. The resin substrate 50 has bosses 55A and 55B. Except for this point, the configuration is similar to that of FIG. 1. As illustrated in FIG. 2, the pins 9A and 9B may penetrate the main substrate 1 from the back surface thereof through the holes opened in the main substrate 1. As illustrated in FIG. 2, for example, the bosses 55A and 55B are formed in the vicinity of the holes 53A and 53B of the resin substrate 50, respectively, and the above-described special region 6 is formed.

(1.3.2 Second Modification)

Figure 3:
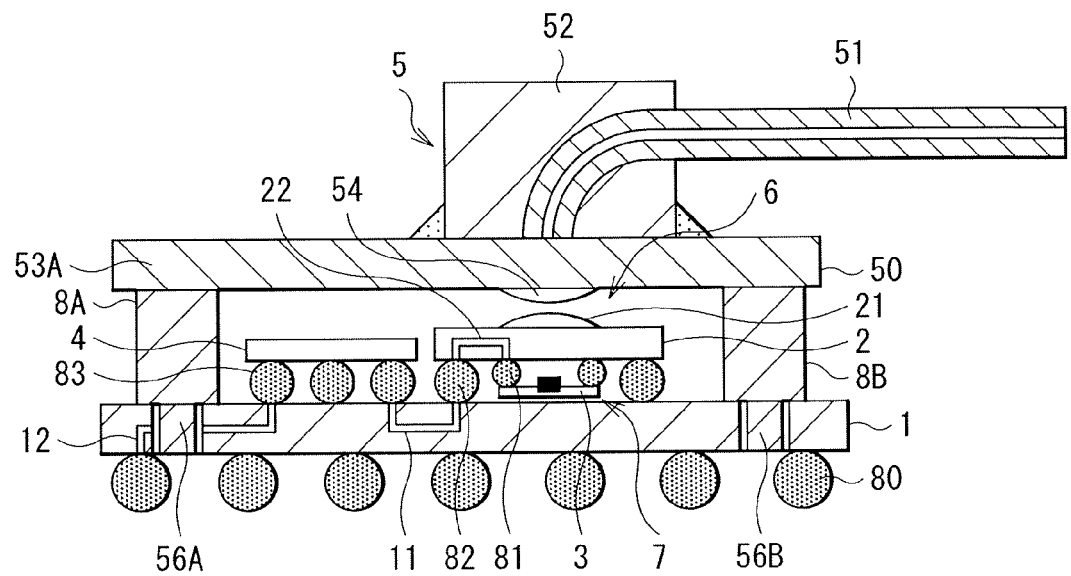
FIG. 3 is a sectional diagram illustrating a configuration example of an optical transmission module according to a second modification of the first embodiment.

FIG. 3 illustrates a configuration example of an optical transmission module according to a second modification of the first embodiment. In the second modification, bosses 56A and 56B are provided in place of the pins 9A and 9B in the configuration of FIG. 2. Except for this point, the configuration is similar to that of FIG. 2. As illustrated in FIG. 3, the bosses 56A and 56B are formed on the resin substrate 50 of the optical connector 50, and are directly inserted and fixed to the holes of the main substrate 1. In this case, the bosses 56A and 56B formed on the optical connector 5 have two-tier structure, which forms the above-described special region 6.

(1.3.3 Third Modification)

Figure 4:
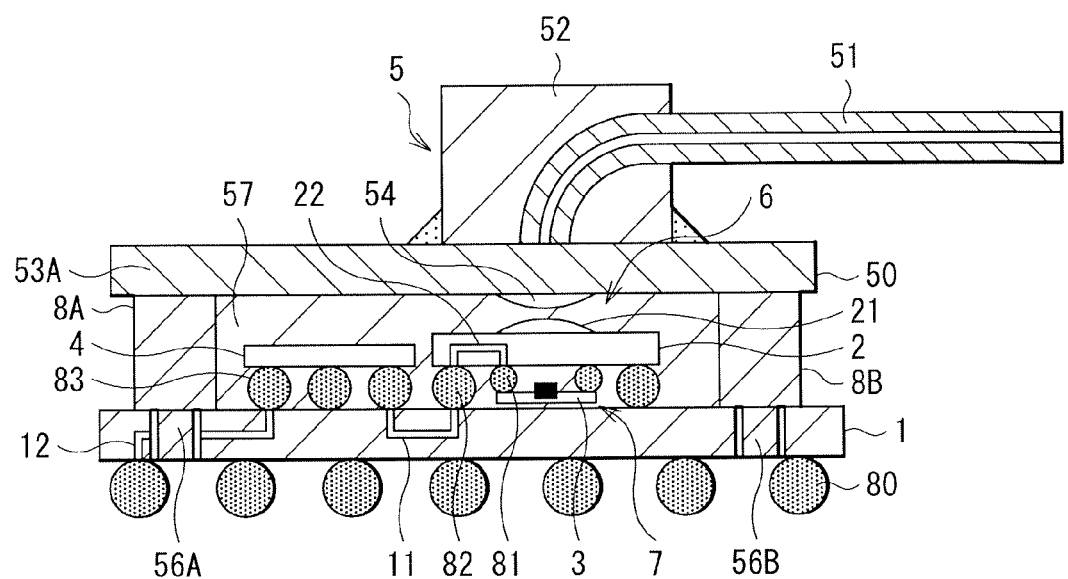
FIG. 4 is a sectional diagram illustrating a configuration example of an optical transmission module according to a third modification of the first embodiment.

FIG. 4 illustrates a configuration example of an optical transmission module according to a third modification of the first embodiment. The configuration of the third modification is substantially similar to that in FIG. 3; however, is provided with a wall 57. As illustrated in FIG. 4, the special region 6 may be formed in such a manner that a square bank (the wall 57) is formed around the lens part 54 of the resin substrate 50 of the optical connector 5. Note that in any of the configurations of FIG. 1 to FIG. 4, the transparent substrate 2 is not in directly contact with the resin substrate 50 of the optical connector 5 in order to prevent stress from being applied to the solder coupling section of the transparent substrate 2.

2. Second Embodiment

Figure 5:
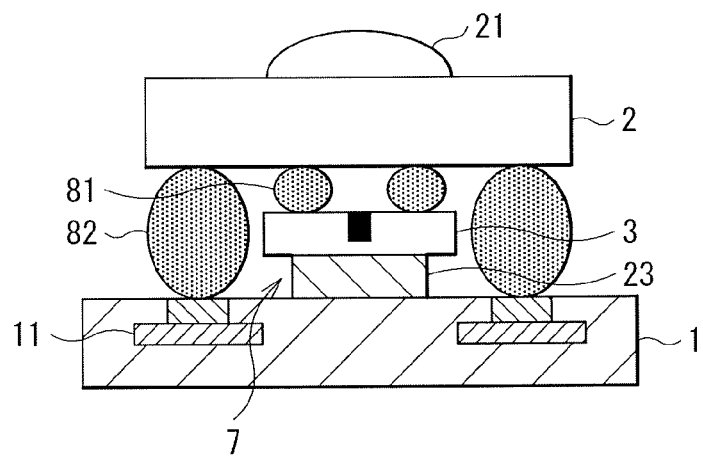
FIG. 5 is a sectional diagram illustrating a configuration example of an optical transmission module according to a second embodiment.

FIG. 5 illustrates a configuration example of an optical transmission module according to a second embodiment.

Incidentally, although a configuration around the transparent substrate 2 and the optical element 3 is only illustrated in FIG. 5, the other configurations are substantially similar to those in FIG. 1.

As illustrated in FIG. 5, the transparent substrate 2 and the main substrate 1 are bonded by a bonding section (a bump 82) using a bonding material (a solder). In the special region 7, a heat conductive material 23 (paste, metal, etc.) is disposed between the optical element 3 as one of heat source elements and the main substrate 1. The heat conductive material 23 is closely disposed (filled) so that the total rigidity thereof is lower than that of the bonding material of the bonding section. The heat conductive material 23 is formed so as not to be in contact with the light emitting section and a light receiving section that are located on an upper surface of the optical element 3. As a result, it is possible to more effectively transfer the heat from the heat source element to the main substrate 1, and to reduce heat emitted to the special region 6 on the optical connector 5 side.

3. Third Embodiment

Figure 6:
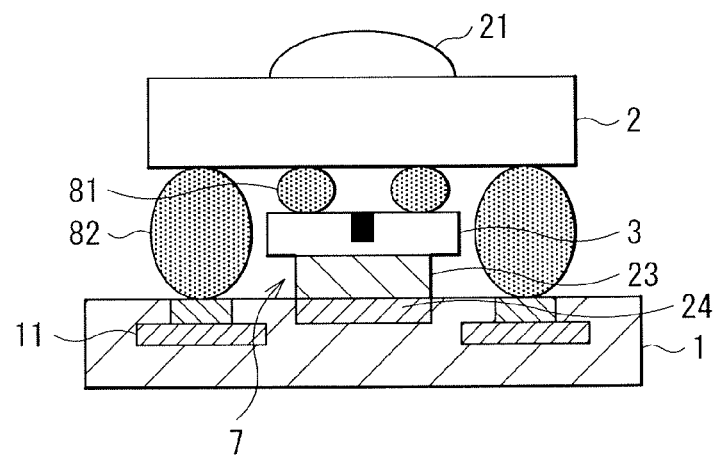
FIG. 6 is a sectional diagram illustrating a configuration example of an optical transmission module according to a third embodiment.

FIG. 6 illustrates a configuration example of an optical transmission module according to a third embodiment.

The configuration of FIG. 6 is substantially similar to that of FIG. 5; however, is provided with a metallic film 24. In the configuration of FIG. 6, the metallic film 24 for thermal diffusion formed of, for example, Cu is provided at a part corresponding to a lower part of the optical element 3 that is one of the heat source elements, in the main substrate 1. As a result, the heat from the heat source element transferred from the heat conductive material 23 is allowed to be effectively diffused. Accordingly, it is possible to more effectively transfer the heat from the heat source element to the main substrate 1, and to further reduce the heat emitted to the special region 6 on the optical connector 5 side.

4. Fourth Embodiment

Figure 7:
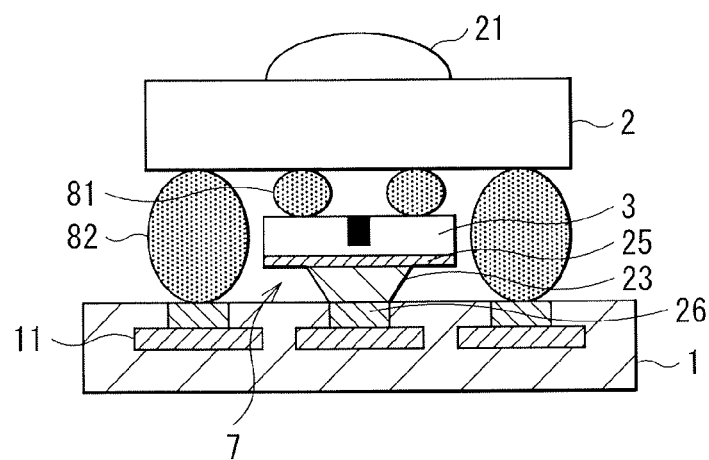
FIG. 7 is a sectional diagram illustrating a configuration example of an optical transmission module according to a fourth embodiment.

FIG. 7 illustrates a configuration example of an optical transmission module according to a fourth embodiment.

The configuration of FIG. 7 is substantially similar to that of FIG. 5; however, is provided with barrier metal layers 25 and 26. As illustrated in FIG. 7, when the heat conductive material 23 is a metal, the barrier metal layers 25 and 26 (for example, Ni, Pt, or the like in the case where the metal is a solder) to suppress the heat diffusion may be preferably formed on a back surface of the heat source element and a metal bonding surface on a counter side to the heat source element. In this case, one or both of areas of the barrier metal layers 25 and 26 may be preferably equal to or smaller than the area of the heat source element (including the same area). For example, when the area of the barrier metal layer 26 on the main substrate 1 side is equal to or smaller than the size of the heat source element and a solder is used as a heat radiation metal, the solder is not spread on the solder resist on the outside of the barrier metal layer 26. Therefore, as illustrated in FIG. 7, it is possible to suppress the solder from creeping up on the side surface of the heat source element and from diffusing into the heat source element. The barrier metal layers 25 and 26 may be preferably formed on both of the back surface of the heat source element and the metal bonding surface on the counter side to the heat source element; however, may be formed on only one of the surfaces. As a result, it is possible to more effectively transfer the heat from the heat source element to the main substrate 1, and to further reduce the heat emitted to the special region 6 on the optical connector 5 side.

5. Fifth Embodiment

Figure 8:
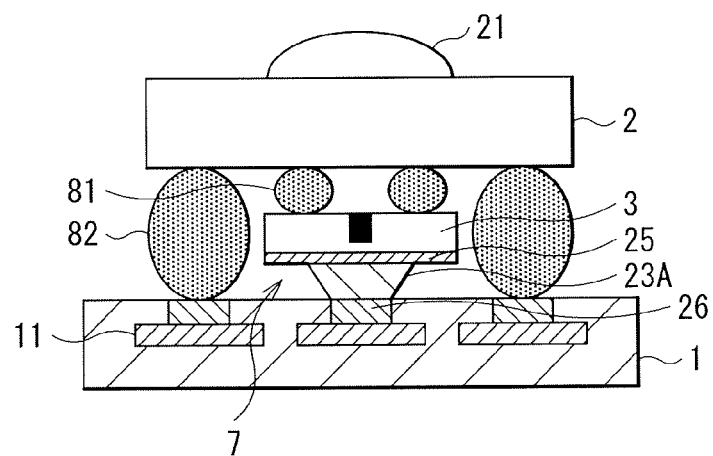
FIG. 8 is a sectional diagram illustrating a configuration example of an optical transmission module according to a fifth embodiment.

FIG. 8 illustrates a configuration example of an optical transmission module according to a fifth embodiment.

The configuration of FIG. 8 is substantially similar to that of FIG. 7; however, is provided with a low-temperature solder 23A as the heat conductive material 23. As illustrated in FIG. 8, when the heat conductive material 23 is a metal, the heat conductive material 23 may be preferably formed of a material (the low-temperature solder 23A) whose melting point is equal to or lower than that of the other solder material. In such a case, the heat radiation metal melts faster and is solidified slowly as compared with melt timing and solidification timing of the other solder bump in a reflow process. Accordingly, it is possible to suppress the heat radiation metal from adversely affecting, in stress, self-alignment positioning of the other solder bump (the bumps 81 and 82, and the like) by a self alignment effect.

6. Sixth Embodiment

A configuration of an optical transmission module according to a sixth embodiment will be described with reference to FIG. 9 to FIG. 11.

(6.1 First Configuration Example)

Figure 9:
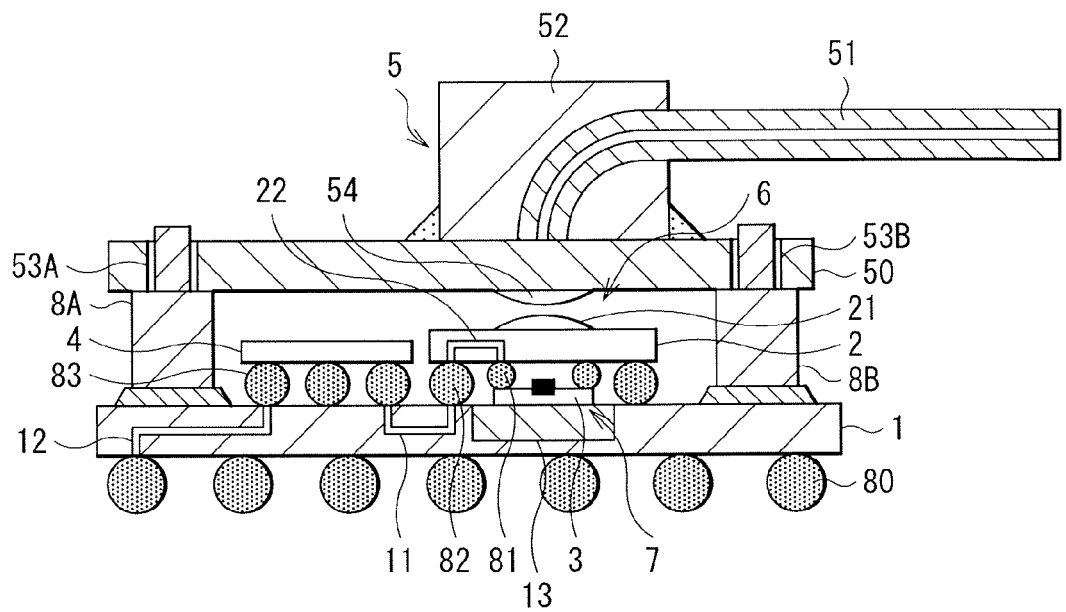
FIG. 9 is a sectional diagram illustrating a first configuration example of an optical transmission module according to a sixth embodiment.

FIG. 9 illustrates a first configuration example of the optical transmission module according to the sixth embodiment.

The configuration of FIG. 9 is substantially similar to that of FIG. 1; however, the main substrate 1 has a concave section 13, and the special region 7 is formed by the concave section 13. The concave section 13 faces the optical element 3 that is one of the heat source elements, and is formed in a part inside the solder bump 82 of the transparent substrate 2. This makes it possible to ensure the larger special region 7 for heat dissipation. Moreover, this makes it possible to allow the heat source element to be partially located between the front surface and the back surface of the main substrate 1 through the concave section 13.

(6.2 Second Configuration Example)

Figure 10:
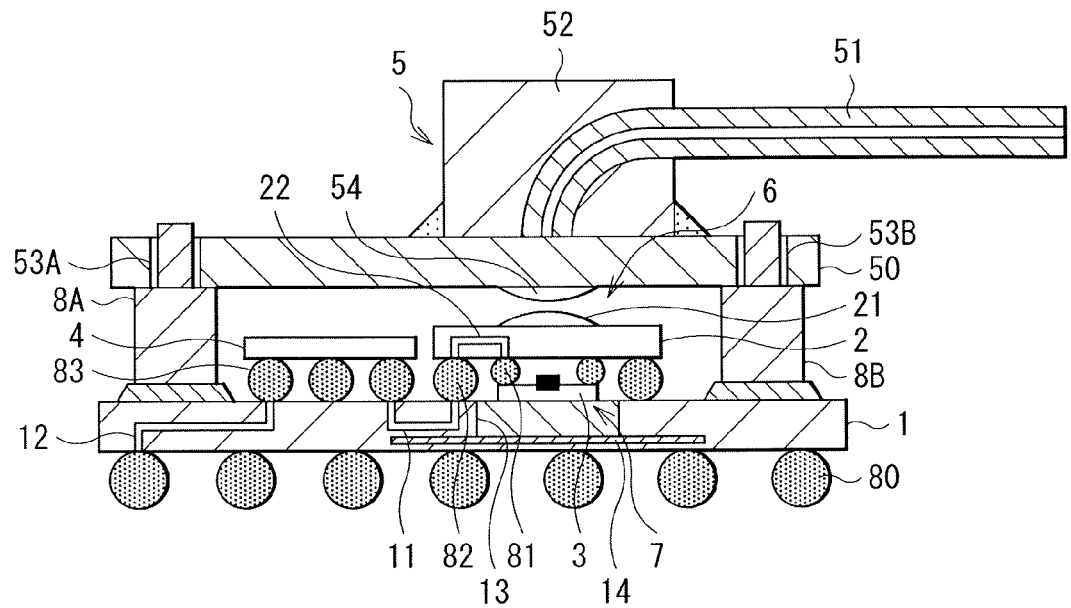
FIG. 10 is a sectional diagram illustrating a second configuration example of the optical transmission module according to the sixth embodiment.

FIG. 10 illustrates a second configuration example of the optical transmission module according to the sixth embodiment.

The configuration of FIG. 10 is substantially similar to that of FIG. 9; however, is further provided with a land wiring layer 14. As illustrated in FIG. 10, by forming a heat diffusion wiring layer (the land wiring layer 14) such as a GND layer on a bottom surface of the concave section 13, it is possible to more effectively transfer the heat from the heat source element to the main substrate 1, and to reduce the heat emitted to the special region 6 on the optical connector 5 side.

(6.3 Third Configuration Example)

Figure 11:
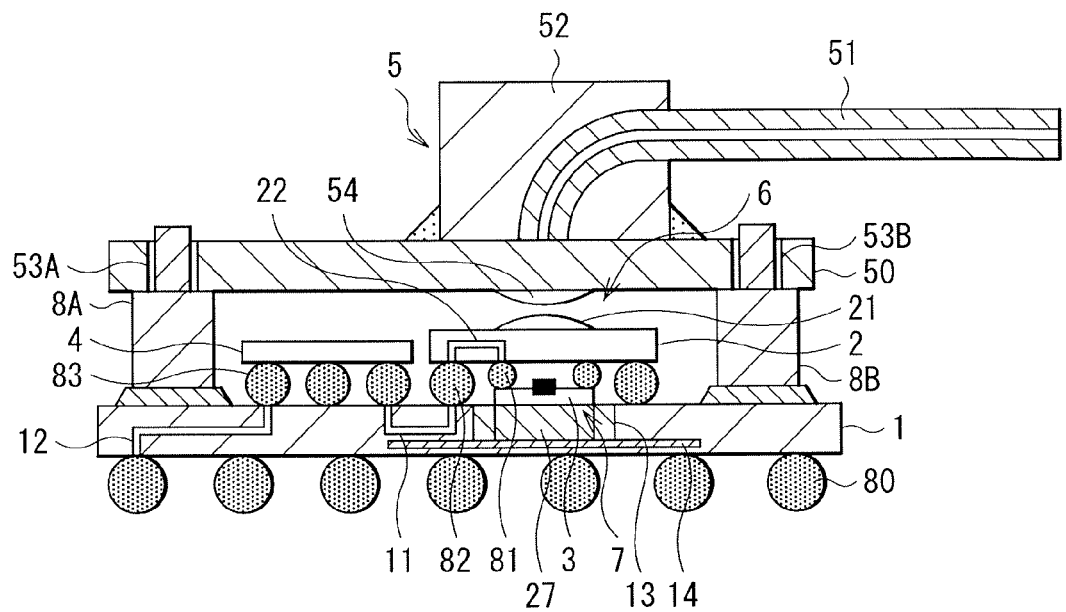
FIG. 11 is a sectional diagram illustrating a third configuration example of the optical transmission module according to the sixth embodiment.

FIG. 11 illustrates a third configuration example of the optical transmission module according to the sixth embodiment.

The configuration of FIG. 11 is substantially similar to that of FIG. 10; however, is further provided with a heat radiation material 27. Moreover, since the body-side special region 7 becomes larger, the heat radiation material 27 or the like as the heat conductive material 23 illustrated in FIG. 5 or the like is easily filled therein, as illustrated in FIG. 11. Further, since the amount of the heat conductive material 23 is also increased, it is possible to further enhance heat radiation property toward the lower side of the heat source element in the body-side special region 7.

Moreover, when the area of the concave section 13 is made larger than that of the heat source element, secondary effect that it is unnecessary to polish the heat source element to be smaller than a clearance distance between the transparent substrate 2 and the main substrate 1 is obtainable. In the optical transmission module, typically, a high speed modulation signal of Gbps order is transmitted between the heat source element mounted on the transparent substrate 2 and the main substrate 1. Therefore, the solder bump 82 (including a post section) that connects the heat source element and the main substrate 1 may preferably have a small capacity, namely, the bump diameter of the bump 82 may be preferably made small. For example, typically, the bump diameter may be equal to or smaller than Φ200 μm. However, in the case where the main substrate 1 has a flat shape, it is necessary for the thickness of the heat source element to be smaller than a value that is obtained by subtracting a sum of a bump size of the heat source element and a necessary clearance between the heat source element and the main substrate 1, from at least 200 μm, in order to put the heat source element in the special region 7. In such a case, for example, the thickness becomes 150 μm or lower, and the difficulty level of the thin polishing process becomes extremely high. Accordingly, the yield of the heat source element is decreased, which results in cost increase of the heat source element. Therefore, in such a viewpoint, large effect is obtainable by formation of the concave section 13.

Furthermore, when the thin polishing is unnecessary, the heat source element, in particular, a light emitting element (VCSEL: vertical cavity surface emitting laser) receives benefit in terms of reliability. The light emitting element is configured by stacking a lot of reflective films, and the vicinity of the light emitting section is extremely vulnerable. The light emitting element is sensitive to external stress, and thus when the thickness of the substrate as a base is small, reliability is deteriorated due to adverse affect from slight external stress. In this respect as well, the formation structure of the concave section 13 allowing the thin polishing to be unnecessary is effective.

Further, an effect that the thermal capacity of the optical element 3 (the heat source element) itself is increased is obtainable by the fact that the thin polishing is unnecessary. The light emitting efficiency of the optical element 3 is lowered and a life time thereof is shortened as operation temperature of the light emitting section of the optical element 3 is increased. When the volume of the substrate of the optical element 3 is increased, the thermal capacity of the optical element 3 itself is increased, which suppresses temperature increase, and therefore, the optical element 3 is difficult to receive the adverse affect.

Moreover, sealing the bump 82 of the transparent substrate 2 by a filler makes it possible to suppress dissipation of the radiation heat from the heat source element to the connector-side special region 6. As the secondary effect, in the case where the heat source element is the optical element 3, it is expected to obtain dust-proof and drip-proof effects in the optical transmission path between the optical element 3 and the transparent substrate 2.

In addition, it is possible to reduce the size of the solder bump 82 (including the post section) between the main substrate 1 and the transparent substrate 2 through which the high speed modulation signal of Gbps order is transmitted, by the fact that interference is eliminated between the back surface of the heat source element and the main substrate 1 by formation of the concave section 13. As a result, a parasitic capacitance of the solder bump 82 becomes smaller, and adverse effect such as signal reflection is allowed to be reduced. Furthermore, design of optical transmission module with higher waveform quality of a high speed signal becomes possible. Consequently, large effects are obtainable by formation of the concave section 13 in such a viewpoint.

7. Seventh Embodiment

A configuration of an optical transmission module according to a seventh embodiment will be described with reference to FIG. 12 and FIG. 13.

(7.1 First Configuration Example)

Figure 12:
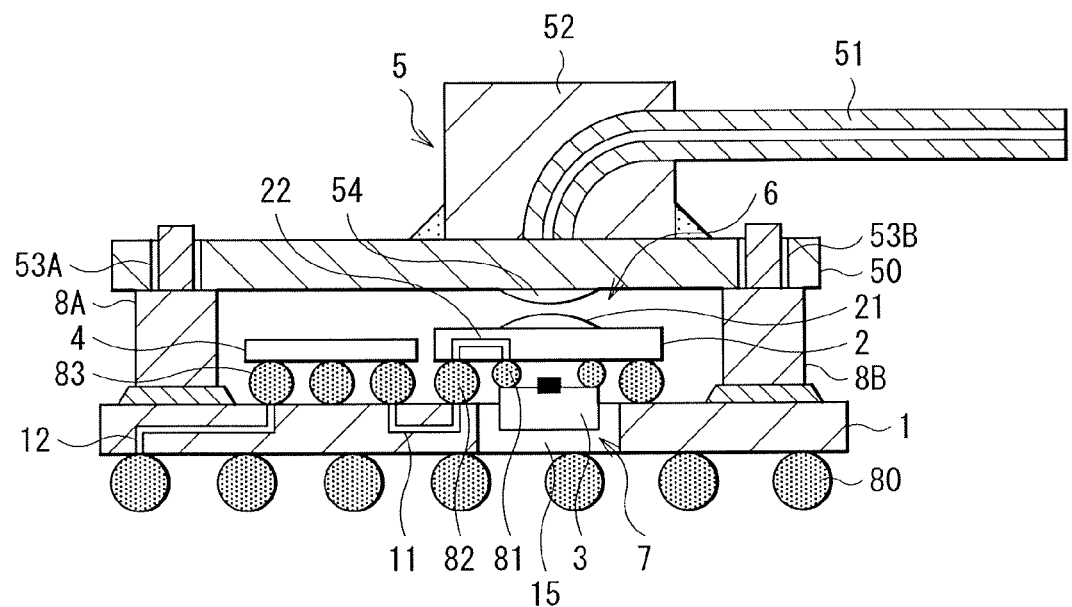
FIG. 12 is a sectional diagram illustrating a first configuration example of an optical transmission module according to a seventh embodiment.

FIG. 12 illustrates a first configuration example of the optical transmission module according to the seventh embodiment.

The configuration of FIG. 12 is substantially similar to that of FIG. 9; however, is provided with a through hole 15 in place of the concave section 13. Changing the structure of the main substrate 1 from a concave (cavity) structure to a structure having the through hole 15 as illustrated in FIG. 12 makes it possible to ensure larger heat radiation space of the body-side special region 7. Further, since the radiation path for the emitted heat is provided up to the back surface side of the main substrate 1, it is possible to further suppress the heat transferred to the connector-side special region 6. Furthermore, it is possible to dispose the heat source element partially between the front surface and the back surface of the main substrate 1 through the through hole 15. This makes it easy to locate the vertical position of the heat source at a position close to a center line of the main substrate 1. As a result, it becomes possible to further suppress warpage of the main substrate 1 associated with thermal expansion, and furthermore, it becomes possible to suppress displacement of the positional relationship between the main substrate 1 and the connector 5.

(7.2 Second Configuration Example)

Figure 13:
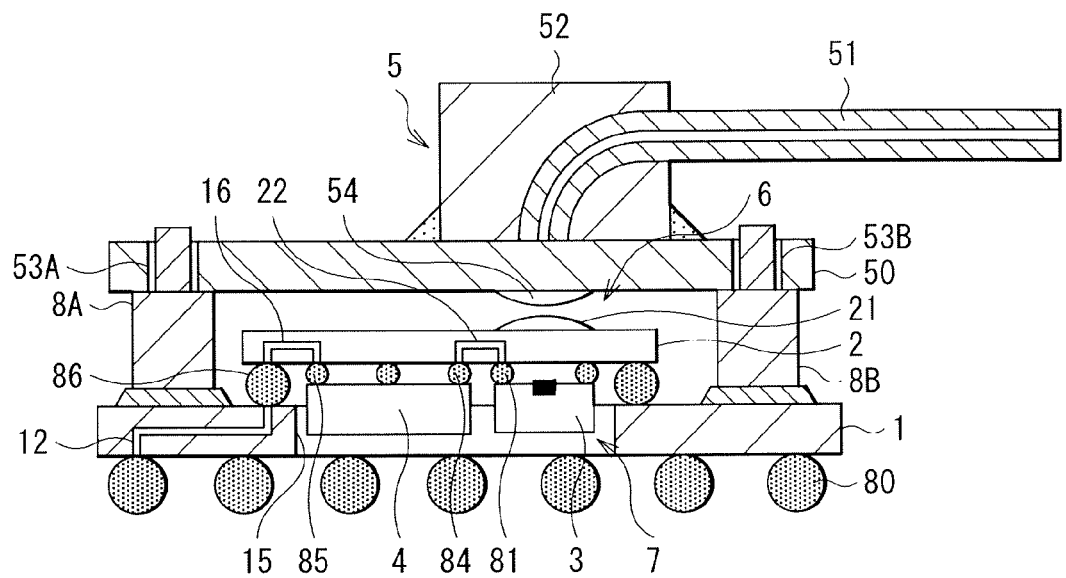
FIG. 13 is a sectional diagram illustrating a second configuration example of the optical transmission module according to the seventh embodiment.

FIG. 13 illustrates a second configuration example of the optical transmission module according to the seventh embodiment.

The configuration of FIG. 13 is substantially similar to that of FIG. 12; however, the width of the through hole 15 is expanded to a position covering the drive element 4. In addition, bumps 84 and 85 that connect the transparent substrate 2 with the drive element 4 are provided. Further, a bump 86 connecting the transparent substrate 2 with the main substrate 1 is provided. In addition, a wiring 16 to electrically connect the drive element 4 with the main substrate 1 is provided. In the configuration of FIG. 13, the vertical position of the heat source is easily positioned at the center line of the main substrate 1. Accordingly, it is possible to further suppress the warpage of the main substrate 1 associated with the thermal expansion. Furthermore, it is possible to suppress displacement of the positional relationship between the main substrate 1 and the optical connector 5.

8. Eighth Embodiment

Figure 14:
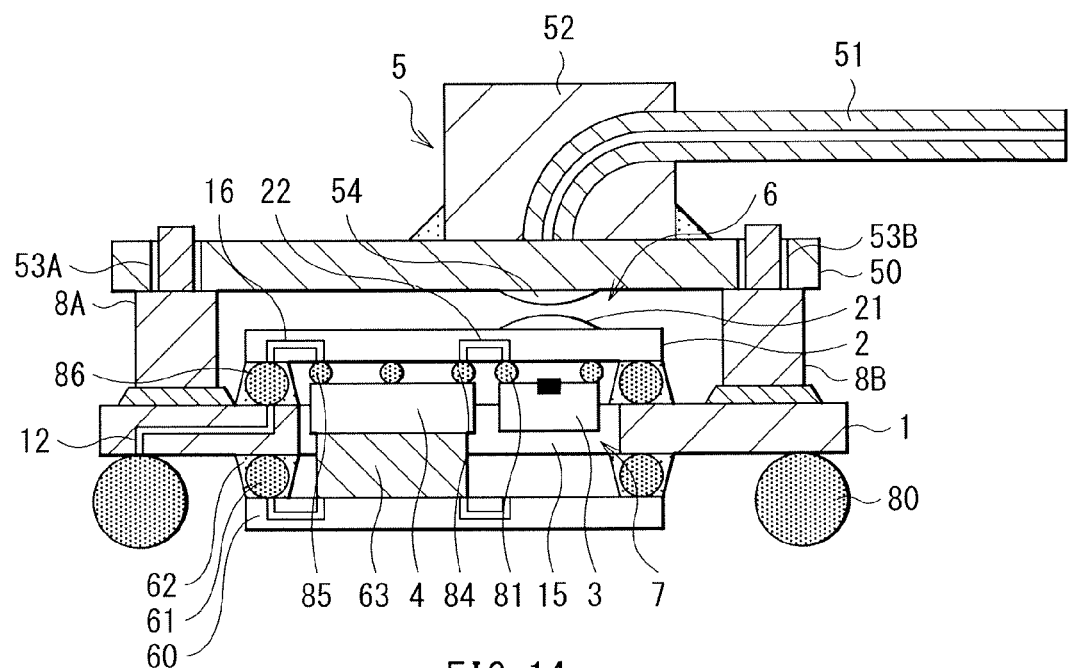
FIG. 14 is a sectional diagram illustrating a configuration example of an optical transmission module according to an eighth embodiment.

FIG. 14 illustrates a configuration example of an optical transmission module according to an eighth embodiment.

The configuration of FIG. 14 is substantially similar to that of FIG. 13; however, is further provided with a transparent substrate 60 (a second transparent substrate).

In the configuration of FIG. 14, the transparent substrate 60 having the same specification as that of the transparent substrate 2 is mounted on the back surface of the main substrate 1 provided with the through hole 15. The main substrate 1 is sandwiched between the transparent substrate 2 and the transparent substrate 60 that have the same specification as each other, which makes it possible to ensure vertical structural balance as viewed from the main substrate 1. As a result, it is possible to further suppress the warpage of the main substrate 1.

Moreover, a heat radiation material 63 or the like is filled between the heat source element and the transparent substrate 60 on the back surface side of the main substrate 1, which makes it possible to release the heat from the heat source element to the back surface side of the main substrate 1. Accordingly, it is possible to further suppress the heat transferred to the connector-side special region 6.

In addition, as described above, when a filler 62 (the sealing material) seals the bump 86 of the upper transparent substrate 2 and the bump 61 of the lower transparent substrate 60, it becomes possible to suppress dissipation of the radiated heat from the heat source element to the connector-side special region 6. As the secondary effect, it is expected to obtain dust-proof and drip-proof effects in the optical transmission path between the optical element 3 and the transparent substrates 2 and 60.

9. Ninth Embodiment

Figure 15:
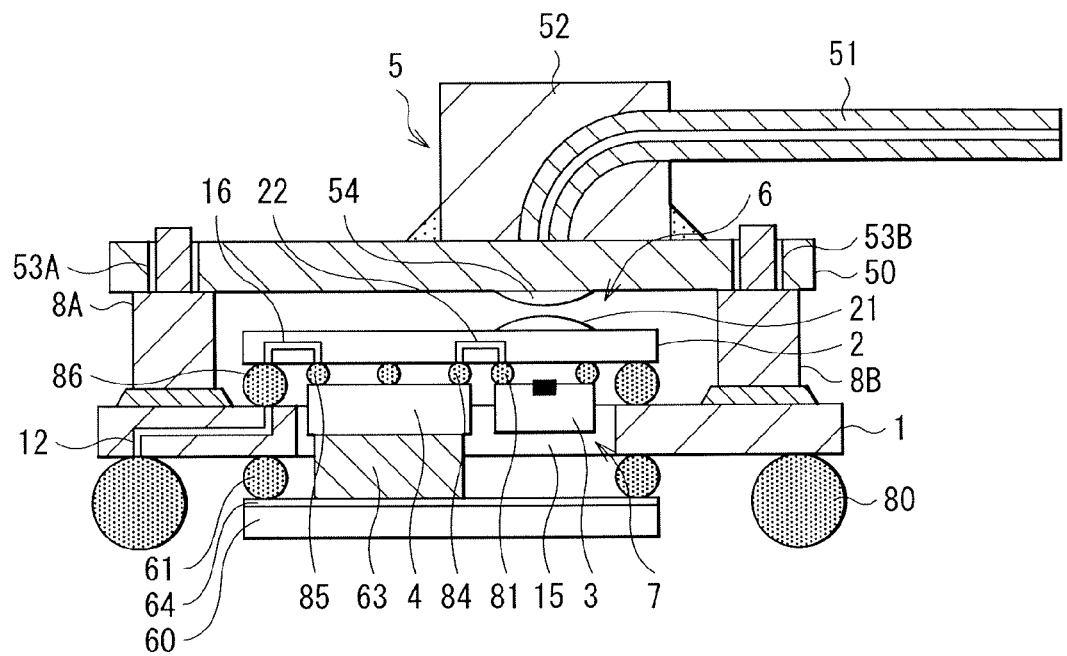
FIG. 15 is a sectional diagram illustrating a configuration example of an optical transmission module according to a ninth embodiment.

FIG. 15 illustrates a configuration example of an optical transmission module according to a ninth embodiment.

The configuration of FIG. 15 is substantially similar to that of FIG. 14; however is further provided with a Cu film 64.

In the case of the configuration of FIG. 14, a heat path between the heat source element and the transparent substrate 2 on the front surface side is ensured through the metal bump 86 having a high thermal conductivity. On the other hand, a heat path between the heat source element and the transparent substrate 60 on the back surface side is formed through the heat radiation material 63 having thermal conductivity lower than that of the metal bump 86. Therefore, heat radiation effect differs between the upper heat radiation path and the lower heat radiation path, which may cause the warpage of the main substrate 1. Accordingly, as illustrated in FIG. 15, the wiring pattern of the transparent substrate 60 on the back surface side may be formed of, for example, the solid Cu film 64, which makes it possible to adjust thermal conductivity to reduce non-uniformity in thermal conductivity. Furthermore, the warpage of the main substrate 1 is suppressed so that the displacement of the positional relationship between the main substrate 1 and the optical connector 5 is suppressed.

10. Tenth Embodiment

Figure 16:
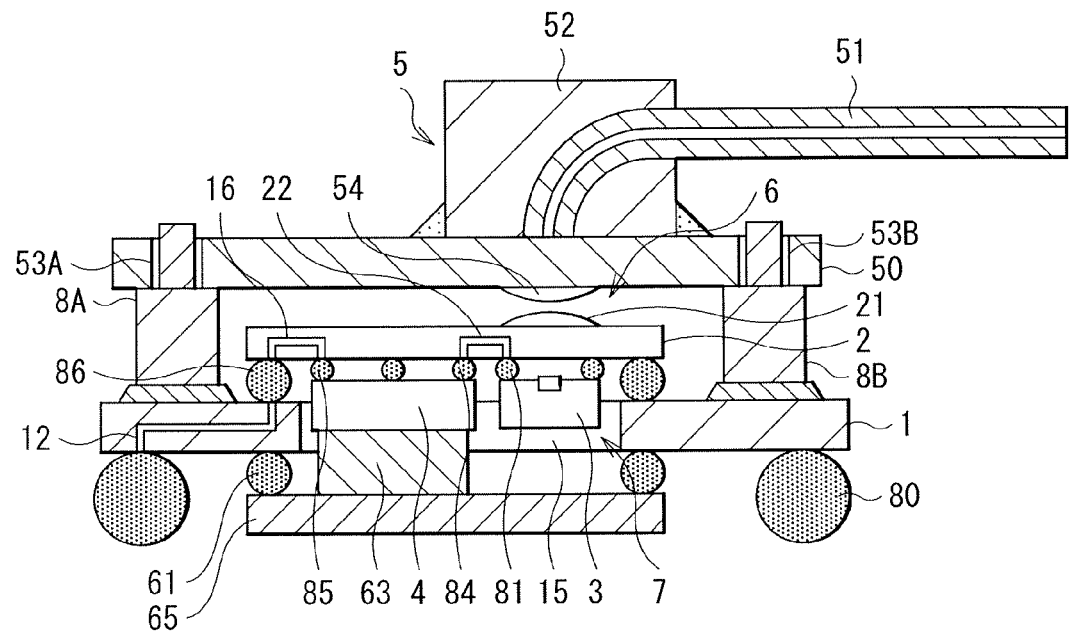
FIG. 16 is a sectional diagram illustrating a configuration example of an optical transmission module according to a tenth embodiment.

FIG. 16 illustrates a configuration example of an optical transmission module according to a tenth embodiment.

The configuration of FIG. 16 is substantially similar to that of FIG. 14; however, is provided with a highly heat conductive substrate 65 such as a Cu substrate, in place of the transparent substrate 60.

When non-uniformity of the thermal conductivity described in the ninth embodiment is large, the thermal conductivity is allowed to be balanced by changing the layer structure or the material of the transparent substrate 60 on the back surface side. For example, arrangement allowing the configuration as a whole to be optimal is possible in such a manner that the transparent substrate 60 on the back surface side is changed to the highly heat conductive substrate 65 such as the Cu substrate as illustrated in FIG. 16, the number of connection bumps on the back surface substrate may be adjusted, connection of the back surface substrate to the main body is performed with use of various adhesives, etc.

11. Eleventh Embodiment

Figure 17:
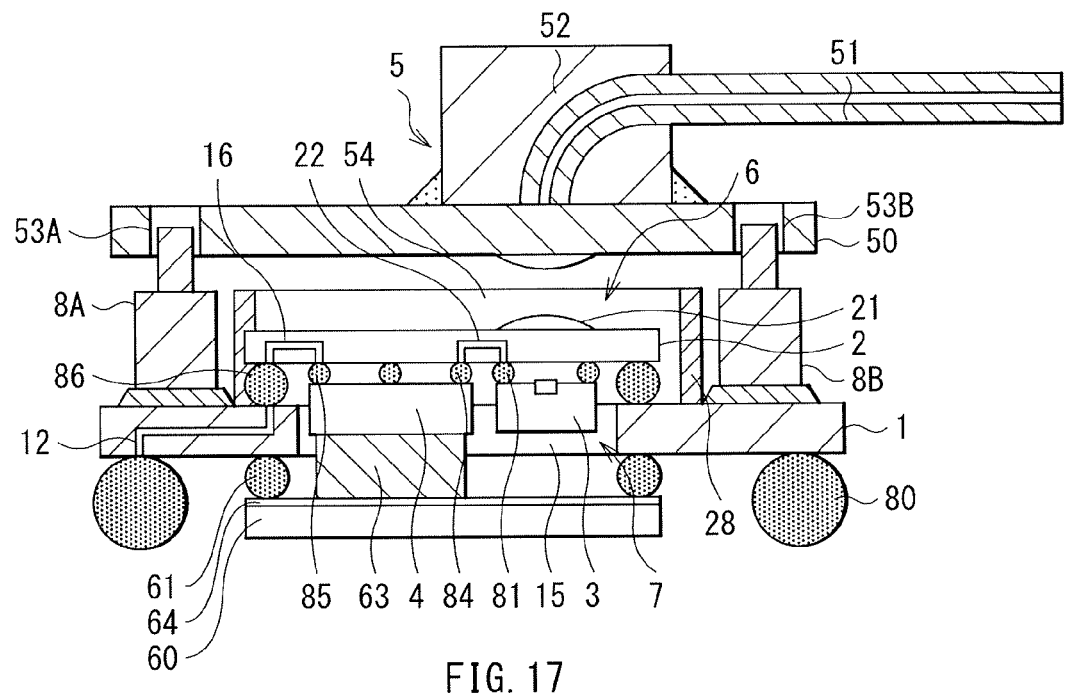
FIG. 17 is a sectional diagram illustrating a configuration example of an optical transmission module according to an eleventh embodiment.

FIG. 17 illustrates a configuration example of an optical transmission module according to an eleventh embodiment.

The configuration of FIG. 17 is substantially similar to that of FIG. 15; however, is further provided with an elastic body 28.

The case where the heat transfer is controlled by the sealing of the bump 86 has been described above (FIG. 14, and the like). Likewise, in the special region 6 on the optical connector 5 side, it is possible to employ a configuration in which sealing is performed between the main substrate 1 and the optical connector 5 by the elastic body 28 with low thermal conductivity and low rigidity, such as urethane, rubber, and plastic, to prevent the heat from flowing into the special region 6 from any path other than a predetermined path. In this case, as a secondary effect, dust-proof and drip-proof effects between the resin substrate 50 of the optical connector 5 and the transparent substrate 2 are allowed to be obtained.

12. Twelfth Embodiment

Figure 18:
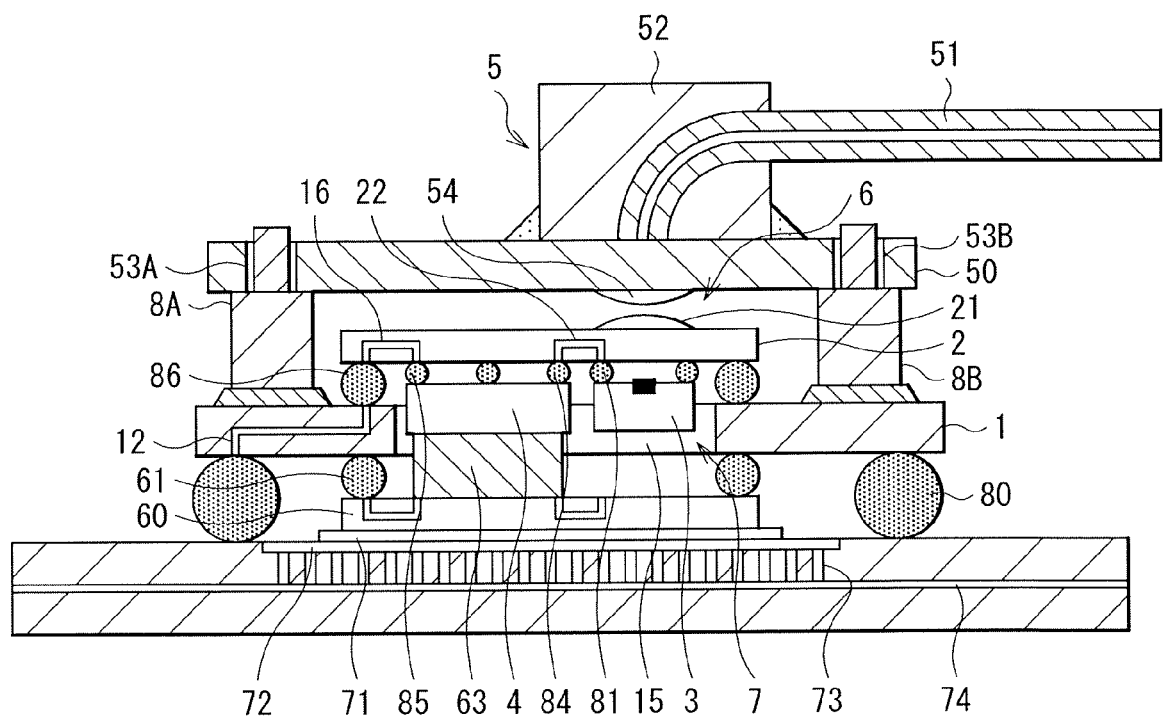
FIG. 18 is a sectional diagram illustrating a configuration example of an optical transmission module according to a twelfth embodiment.

FIG. 18 illustrates a configuration example of an optical transmission module according to a twelfth embodiment.

The configuration of FIG. 18 is substantially similar to that of FIG. 14; however, is further provided with a heat radiation material 71, a land layer 72, a thermal via 73, and a GND layer 74 on the mother board 10 side.

When the heat conductive material (a heat radiation material 71) is filled in a space between the transparent substrate 60 on the back surface side and the mother board 10 just blow the transparent substrate 60, heat radiation effect to the lower side of the main substrate 1 is enhanced, and as a result, it is possible to suppress the heat transferred to the special region 6 on the optical connector 5 side. In this case, providing the Cu thermal via 73 and the Cu land (the land layer 72) on the mother board 10 makes it possible to further enhance heat radiation property.

13. Thirteenth Embodiment

Figure 19:
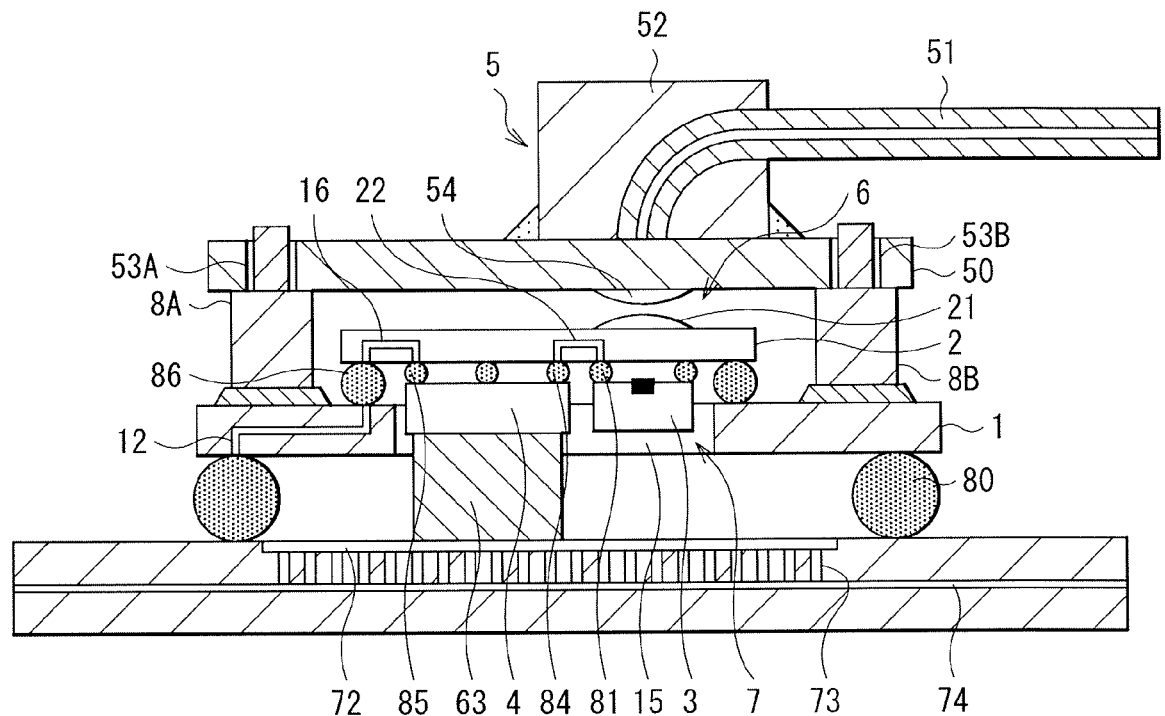
FIG. 19 is a sectional diagram illustrating a configuration example of an optical transmission module according to a thirteenth embodiment.

FIG. 19 illustrates a configuration example of an optical transmission module according to a thirteenth embodiment.

As illustrated in FIG. 19, as a modification of the configuration of FIG. 18, a configuration from which the transparent substrate 60 on the back surface side is omitted may be employed.

14. Fourteenth Embodiment

Figure 20:
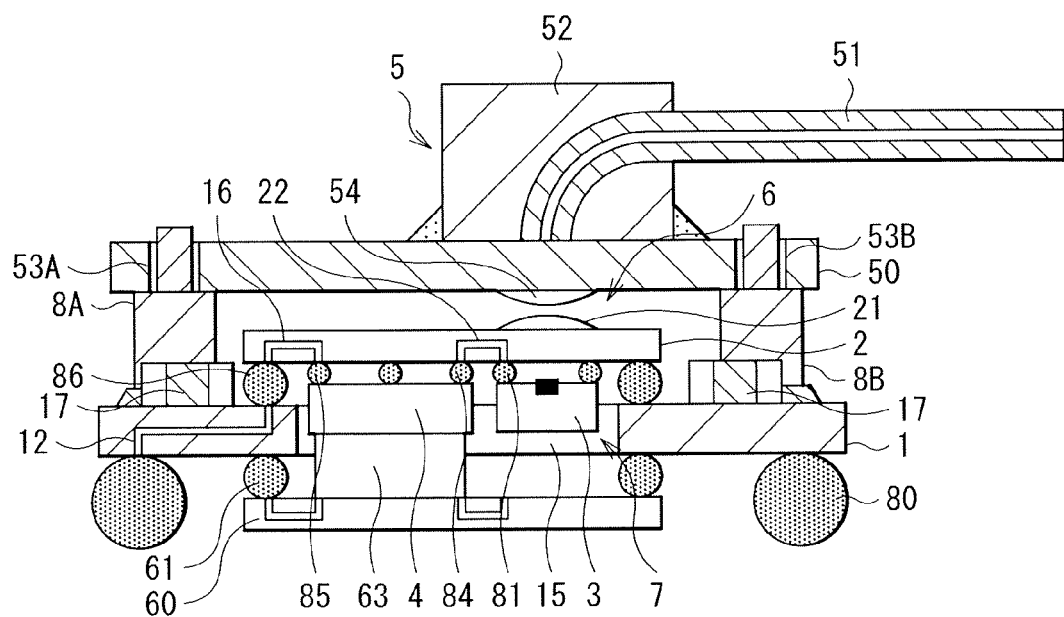
FIG. 20 is a sectional diagram illustrating a configuration example of an optical transmission module according to a fourteenth embodiment.

FIG. 20 illustrates a configuration example of an optical transmission module according to a fourteenth embodiment.

As illustrated in FIG. 20, as a modification of the configuration of FIG. 14, a passive element 17 (such as a capacitor and a resistor) may be mounted on the main substrate 1, and the mechanical rigidity of the main substrate 1 may be enhanced to suppress the thermal deformation of the main substrate 1. Furthermore, the thermal deformation of the main substrate 1 is suppressed, which makes it possible to suppress displacement of the positional relationship between the main substrate 1 and the optical connector 5.

15. Fifteenth Embodiment

Figure 21:
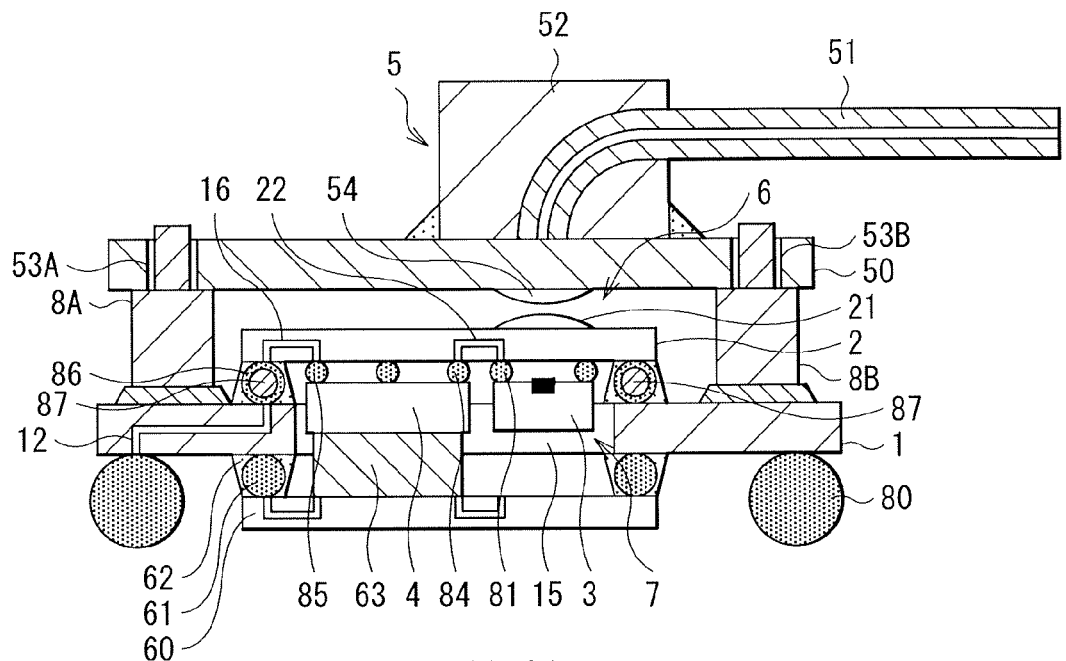
FIG. 21 is a sectional diagram illustrating a configuration example of an optical transmission module according to a fifteenth embodiment.

FIG. 21 illustrates a configuration example of an optical transmission module according to a fifteenth embodiment.

As illustrated in FIG. 21, as a modification of the configuration of FIG. 14, a configuration in which a core material 87 having higher thermal conductivity such as Cu is sealed in the bump 86 of the transparent substrate 2 is also effective. In this case, it is expected to obtain an effect of enhancing the thermal conductivity as well as an effect of suppressing inclination of the transparent substrate 2, as the secondary effect. The same applies to all of the solder bumps configuring the module, and thus the effects of the application are expected.

16. Sixteenth Embodiment

Figure 22:
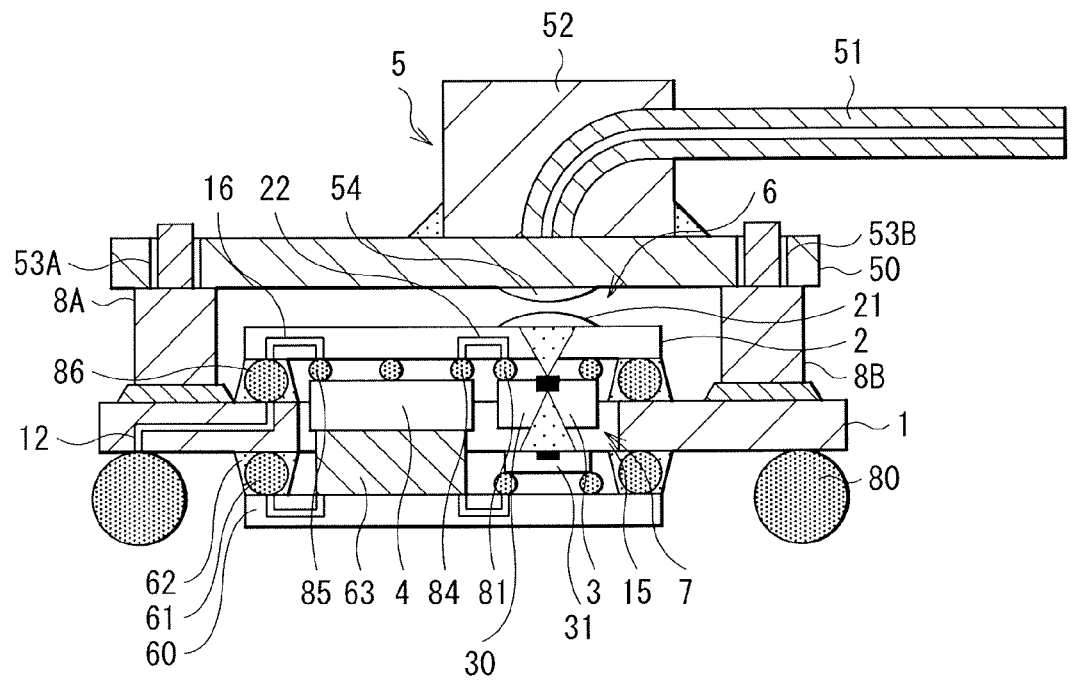
FIG. 22 is a sectional diagram illustrating a configuration example of an optical transmission module according to a sixteenth embodiment.

FIG. 22 illustrates a configuration example of an optical transmission module according to a sixteenth embodiment.

As illustrated in FIG. 22, as a modification of the configuration of FIG. 14, a configuration in which a light emitting element and a photodetector as the heat source elements are provided on one optical axis between the transparent substrate 2 and the transparent substrate 60 may be employed.

As illustrated in FIG. 22, a configuration in which a both-sides light emitting element 30 is applied as a light emitting element and a photodetector 31 is mounted between the transparent substrate 60 on the back surface side and the light emitting element may be employed. Alternatively, a configuration in which a light-transmissive light emitting element or photodetector is mounted on an upper side through a hole structure, and the photodetector 31 or light emitting element is disposed on the transparent substrate 60 on the back surface side may be employed. In this configuration, optical output of the light emitting element is allowed to be monitored by the photodetector 31 at the same time of light emission. Moreover, bidirectional optical transmission is allowed in one-channel optical transmission path. As described above, various combinations in the positional relationship between the light emitting element and the photodetector are possible.

17. Seventeenth Embodiment

Figure 23:
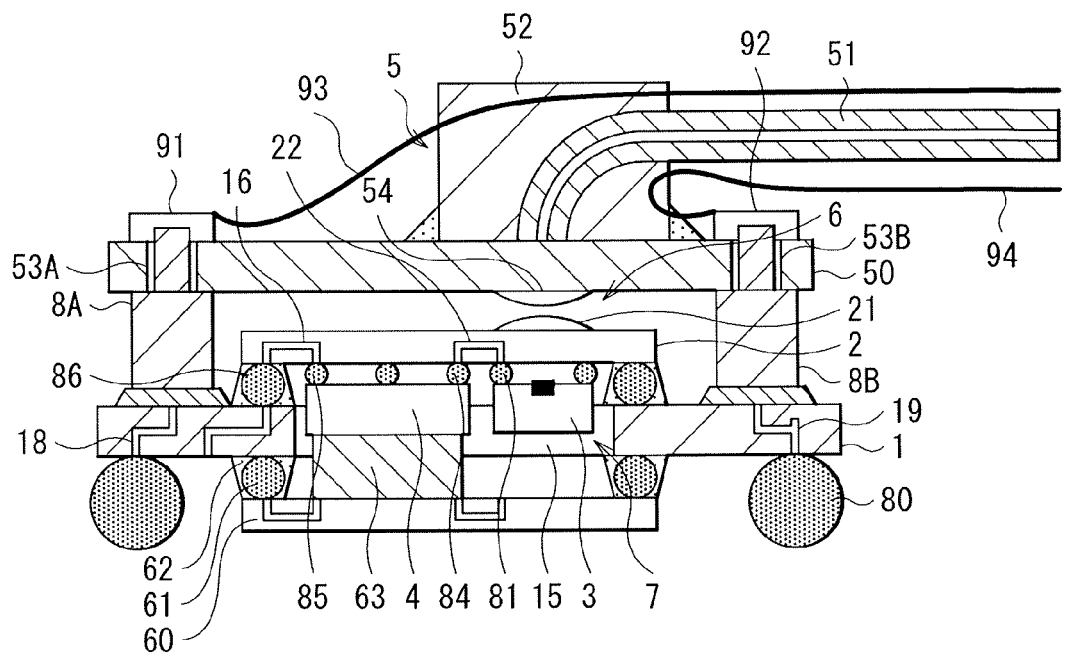
FIG. 23 is a sectional diagram illustrating a configuration example of an optical transmission module according to a seventeenth embodiment.

FIG. 23 illustrates a configuration example of an optical transmission module according to a seventeenth embodiment.

As illustrated in FIG. 23, as a modification of the configuration of FIG. 14, a configuration in which an electrical wiring to connect the positioning pins 8A and 8B with a power system or a signal system is further provided may be employed.

The lens substrate (the resin substrate 50) of the optical connector 5 is desired to have high accuracy in terms of positioning holes (the holes 53A and 53B), the positional relationship with the lens, and its shapes. For example, there is a case where variation in positional accuracy of $\pm 10$ μm or lower is demanded. On the other hand, it is necessary to flexibly absorb slightly generated displacement of the positional relationship between the positioning pins 8A and 8B and the holes (the holes 53A and 53B) without backlash. In addition, to reduce its cost, preferably, an injection-moldable resin material may be employed as the material of the resin substrate 50, and the lens part 54 and the holes 53A and 53B may be formed by integral molding. As a result, it is possible to achieve high accuracy at a time.

For the reason described above, an engaging state between the holes (the holes 53A and 53B) of the resin substrate 50 of the optical connector 5 and the positioning pins 8A and 8B is allowed to be maintained without backlash. Therefore, the positioning pins 8A and 8B may be electrically connected with the power system such as GND and Vcc (through a Vcc wiring 18 and a GND wiring 19).

Alternatively, any signal system may be connected with the main substrate 1. When electric terminals that are connected similarly to electric cables are provided in the holes (the holes 53A and 53B) of the optical connector 5, photoelectrical composition of the optical module is allowed to be achieved. For example, an electric terminal 91 may be provided above the hole 53A, and may be connected to an electric cable 93. Moreover, for example, an electric terminal 92 may be provided above the hole 53B, and may be connected to an electric cable 94.

Alternatively, on the optical connector 5 side, a wiring that allows the positioning holes (the holes 53A and 53B) to be electrically short-circuited is provided, and the optical connector 5 is engaged with the positioning pins 8A and 8B. As a result, the positioning pins 8A and 8B are electrically short-circuited, which makes it possible to monitor attachment and detachment state of the optical connector 5. For example, if an algorism circuit forcibly stopping a laser beam at the time when for example, the optical connector 5 is disconnected and the short-circuit path is opened is incorporated, it is possible to provide the optical transmission module with a function corresponding to eye safety.

18. Eighteenth Embodiment

Figure 24:
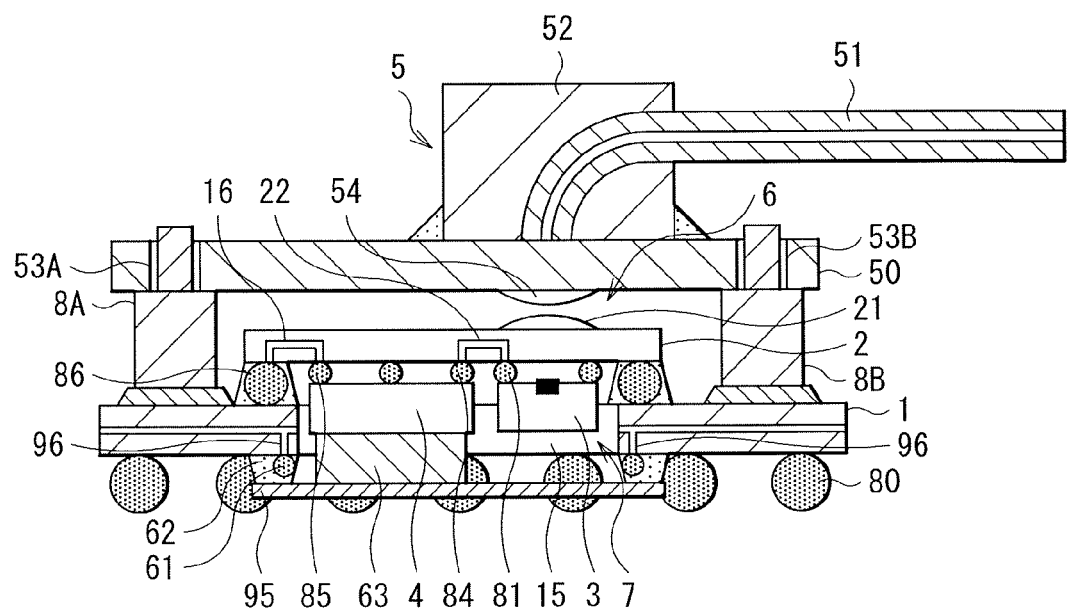
FIG. 24 is a sectional diagram illustrating a configuration example of an optical transmission module according to an eighteenth embodiment.

FIG. 24 illustrates a configuration example of an optical transmission module according to an eighteenth embodiment.

As illustrated in FIG. 24, as a modification of the configuration of FIG. 14, a configuration in which a metal substrate 95 is provided in place of the transparent substrate 60 may be employed.

Further, as illustrated in FIG. 24, it is possible to provide vias 96 such as GND around the through hole 15 to enhance EMC resistance inside the through hole 15. In this case, it is possible to further enhance the effect by providing a Cu land layer in a space section of the transparent substrate 2, and replacing the transparent substrate 60 on the back surface side with a metal substrate 95.

Incidentally, in the configuration in which the main substrate 1 has the cavity section (the concave section 13) illustrated in FIG. 9 and the like, it is possible to enhance the EMC resistance by providing the vias 96 such as GND around the concave section 13.

19. Other Embodiments

The technology of the present disclosure is not limited to description of the above-described embodiments, and various modifications may be made.

For example, the present technology may be configured as follows.

(1) An optical transmission module including:
a main substrate having a front surface and a back surface;
an optical connector having a connector substrate;
a first transparent substrate disposed between the connector substrate and the main substrate;
a heat source element disposed between the connector substrate and the back surface of the main substrate, and electrically connected to the main substrate;
one or a plurality of wirings electrically connecting the heat source element to the main substrate, and each configured to transfer heat generated from the heat source element and the first transparent substrate, to the main substrate;
a first special region provided between the connector substrate and the first transparent substrate to prevent the heat generated from the heat source element and the first transparent substrate, from being transferred to the connector substrate; and
a second special region provided between the heat source element and the back surface of the main substrate to provide a function of transferring the heat generated from the heat source element and the first transparent substrate.

(2) The optical transmission module according to (1), further including:
a bonding section bonding the first transparent substrate to the main substrate with use of a bonding material; and
a heat conductive material disposed in the second special region, and having rigidity lower than rigidity of the bonding material of the bonding section.

(3) The optical transmission module according to (2), further including
a metal film for thermal diffusion provided between the heat conductive material and the back surface of the main substrate.

(4) The optical transmission module according to (2) or (3), further including
a barrier metal layer provided between the heat conductive material and the heat source element or between the heat conductive material and the main substrate or barrier metal layers provided between the heat conductive material and the heat source element and between the heat conductive material and the main substrate, wherein
the heat conductive material is a metal, and
the barrier metal layers each have an area equal to or smaller than an area of the heat source element.

(5) The optical transmission module according to any one of (2) to (4), wherein
the first transparent substrate and the main substrate are bonded to each other with use of a solder material, and the heat source element and the first transparent substrate are bonded to each other with use of the solder material as well, and
the heat conductive material is a metal having a melting point equal to or lower than a melting point of the solder material.

(6) The optical transmission module according to any one of (1) to (5), wherein
the first transparent substrate has a first optical element provided to face the connector substrate,
the heat source element is disposed between the first transparent substrate and the main substrate, and
the first optical element and the heat source element are disposed on one optical axis.

(7) The optical transmission module according to any one of (1) to (6), wherein
the connector substrate has a second optical element and a positioning hole, and
the second optical element, the positioning hole, and the connector substrate are integrally molded with use of a injection-moldable resin material.

(8) The optical transmission module according to any one of (1) to (7), wherein
the main substrate has one of a concave section and a through hole, and
one of the concave section and the through hole configures the second spatial region.

(9) The optical transmission module according to (8), wherein part of the heat source element is located inside the concave section or the through hole.

(10) The optical transmission module according to any one of (1) to (9), further including a solder bump connecting the first transparent substrate and the main substrate, wherein the solder bump has a diameter equal to or lower than a thickness of the heat source element.

(11) The optical transmission module according to any one of (1) to (10), wherein an optical element and a drive element for the optical element that configure the heat source element are provided.

(12) The optical transmission module according to any one of (1) to (11), further including a heat radiation material, and one of a second transparent substrate and a highly heat conductive substrate, wherein the heat source element and the main substrate are disposed between the first transparent substrate and the second transparent substrate or between the first transparent substrate and the highly heat conductive substrate, and the heat radiation material is disposed between the heat source element and the second transparent substrate or between the heat source element and the highly heat conductive substrate.

(13) The optical transmission module according to (12), further including a structure allowing thermal conductivity between the first transparent substrate and the heat source element to be equal to thermal conductivity between the second transparent substrate and the heat source element or between the highly heat conductive substrate and the heat source element.

(14) The optical transmission module according to (12) or (13), further including:

a first solder bump connecting the first transparent substrate with the main substrate;

a second solder bump connecting the second transparent substrate with the main substrate; and a sealing member that seals up the first solder bump and the second solder bump to suppress diffusion of the heat.

(15) The optical transmission module according to any one of (1) to (14), further including an elastic body between the main substrate and the optical connector, the elastic body preventing heat inflow.

(16) The optical transmission module according to any one of (12) to (14), wherein a light emitting element and a photodetector are provided on one optical axis between the first transparent substrate and the second transparent substrate, the light emitting element and the photodetector configure the heat source element.

(17) The optical transmission module according to any one of (1) to (16), further including:

a positioning pin connecting the main substrate with the connector substrate; and an electrical wiring connecting the positioning pin to a power system or a signal system.

(18) The optical transmission module according to (8), wherein the main substrate has a via formed around the concave section or the through hole.

(19) The optical transmission module according to any one of (1) to (18), further including a passive element provided on the front surface of the main substrate, and configured to suppress thermal deformation of the main substrate.

(20) The optical transmission module according to any one of (1) to (19), further including a solder bump connecting the main substrate with the first transparent substrate, the solder bump including a core material therein.

It should be understood by those skilled in the art that various modifications, combinations, sub-combinations, and alterations may occur depending on design requirements and other factors insofar as they are within the scope of the appended claims or the equivalents thereof.

What is claimed is:

1. An optical transmission module comprising:
   a first substrate having a surface;
   a driving circuit disposed over the surface of the first substrate;
   one or more wirings disposed in contact with the first substrate;
   a metal layer disposed on the one or more wirings;
   a heat conductive material disposed on the metal layer;
   an optical element having a first surface and a second surface and including a light emitting element, the second surface of the optical element disposed over the heat conductive material, the metal layer, and the one or more wirings along a plane that is transverse to the second surface of the optical element, and the optical element is electrically connected to the driving circuit via the one or more wirings;
   a second substrate having a first surface and a second surface;
   a lens disposed on the first surface of the second substrate; and
   a connection member that connects together the first surface of the second substrate and the surface of the first substrate,
   wherein the first surface of the second substrate is separated from the second surface of the optical element by a predetermined distance.

2. The optical transmission module according to claim 1, wherein the optical element further includes a photo detector.

3. The optical transmission module of claim 1, wherein the second substrate and the lens are integrally molded.

4. The optical transmission module of claim 1, further comprising side walls that surround the optical element.

5. The optical transmission module of claim 1, further comprising:
   a third substrate; and
   a second connection member that connects together a first surface of the third substrate and the surface of the first substrate,
   wherein, in a cross-sectional view, a first width of the second connection member near the first surface of the first substrate is smaller than a second width of the second connection member near the surface of the first substrate.

6. The optical transmission module of claim 5, wherein the second connection member is a pin.

7. The optical transmission module of claim 5, wherein the second connection member includes a resin and an adhesive.

8. The optical transmission module according to claim 5, further comprising:
   an electrical wiring connecting the second connection member to a power system or a signal system.

9. The optical transmission module of claim 1, wherein the predetermined distance is in a special region.

10. The optical transmission module of claim 1, wherein the heat conductive material is a paste.

11. The optical transmission module of claim 1, wherein the heat conductive material is a metal.

12. The optical transmission module according to claim 1, wherein the heat conductive material has a first rigidity lower than a second rigidity of the connection member.

13. The optical transmission module of claim 1, wherein the metal layer is a barrier metal layer.

14. The optical transmission module of claim 1, wherein the metal layer is a layer of nickel (Ni) or a layer of platinum (Pt).

15. The optical transmission module according to claim 1, wherein the metal layer has a first area equal to or smaller than a second area of the optical element.

16. The optical transmission module according to claim 1, further comprising:
   a first solder material that bonds the optical element to the second substrate,
   wherein the connection member is a second solder material, and wherein the heat conductive material is a metal having a first melting point equal to or lower than a second melting point of the first solder material and the second solder material.

17. The optical transmission module according to claim 1, wherein the connection member is a solder bump connecting the first surface of the second substrate to the surface of the first substrate, wherein the solder bump has a diameter equal to or lower than a thickness of the optical element.

18. The optical transmission module according to claim 17, wherein the solder bump includes a core material.

19. The optical transmission module according to claim 1, further comprising
   a passive element provided on the surface of the first substrate, the passive element configured to suppress thermal deformation of the first substrate.

* * * * *